United States Patent
Jungreithmair et al.

(10) Patent No.: US 12,265,113 B2
(45) Date of Patent: Apr. 1, 2025

(54) MONITORING DEVICE FOR EMERGENCY STANDBY OPERATION

(71) Applicant: Fronius International GmbH, Pettenbach (AT)

(72) Inventors: Roland Jungreithmair, Wels-Thalheim (AT); Stefan Wieser, Wels-Thalheim (AT); Martin Wolf, Wels-Thalheim (AT); Bernhard Doppelbauer, Wels-Thalheim (AT)

(73) Assignee: Fronius International GmbH, Pettenbach (AT)

( * ) Notice: Subject to any disclaimer, the term of this patent is extended or adjusted under 35 U.S.C. 154(b) by 111 days.

(21) Appl. No.: 18/038,877

(22) PCT Filed: Nov. 25, 2021

(86) PCT No.: PCT/EP2021/082950
§ 371 (c)(1),
(2) Date: May 25, 2023

(87) PCT Pub. No.: WO2022/112393
PCT Pub. Date: Jun. 2, 2022

(65) Prior Publication Data
US 2023/0408569 A1    Dec. 21, 2023

(30) Foreign Application Priority Data
Nov. 26, 2020    (EP) ..................................... 20210023

(51) Int. Cl.
*G01R 31/14*    (2006.01)
*G01R 31/12*    (2020.01)

(52) U.S. Cl.
CPC ................................ *G01R 31/1227* (2013.01)

(58) Field of Classification Search
CPC ........ G01R 27/18; G01R 31/42; G01R 31/52; G01R 31/1227; H02H 7/48; H02H 7/122; H02H 3/16; H02H 3/33; H02M 1/32
See application file for complete search history.

(56) References Cited

U.S. PATENT DOCUMENTS 6,611,441 B2 *   8/2003   Kurokami ............... H02M 7/48
                                                       363/56.02
8,854,846 B2 *  10/2014   Nuss ....................... H02M 7/44
                                                       363/56.02

(Continued)

FOREIGN PATENT DOCUMENTS

DE    10 2014 109 513    1/2015
DE    10 2016 103 883    9/2016

(Continued)

OTHER PUBLICATIONS

Int'l Search Report (Form PCT/ISA/210) conducted in Int'l Appln. No. PCT/EP2021/082950 (Mar. 4, 2022).

(Continued)

*Primary Examiner* — Thang X Le
(74) *Attorney, Agent, or Firm* — GREENBLUM & BERNSTEIN, P.L.C.

(57) ABSTRACT

To determine an AC insulation resistance between the AC connections of an inverter and a ground potential, the AC connections are connected to an AC energy sink in an emergency standby operation in order to transmit energy from a DC energy source to an AC energy sink and an insulation test is performed in emergency standby operation. An AC fault current flowing between an AC connection and the ground potential is determined, and the AC insulation resistance is calculated from the AC fault current.

16 Claims, 6 Drawing Sheets

(56) References Cited

U.S. PATENT DOCUMENTS

Figure 1:
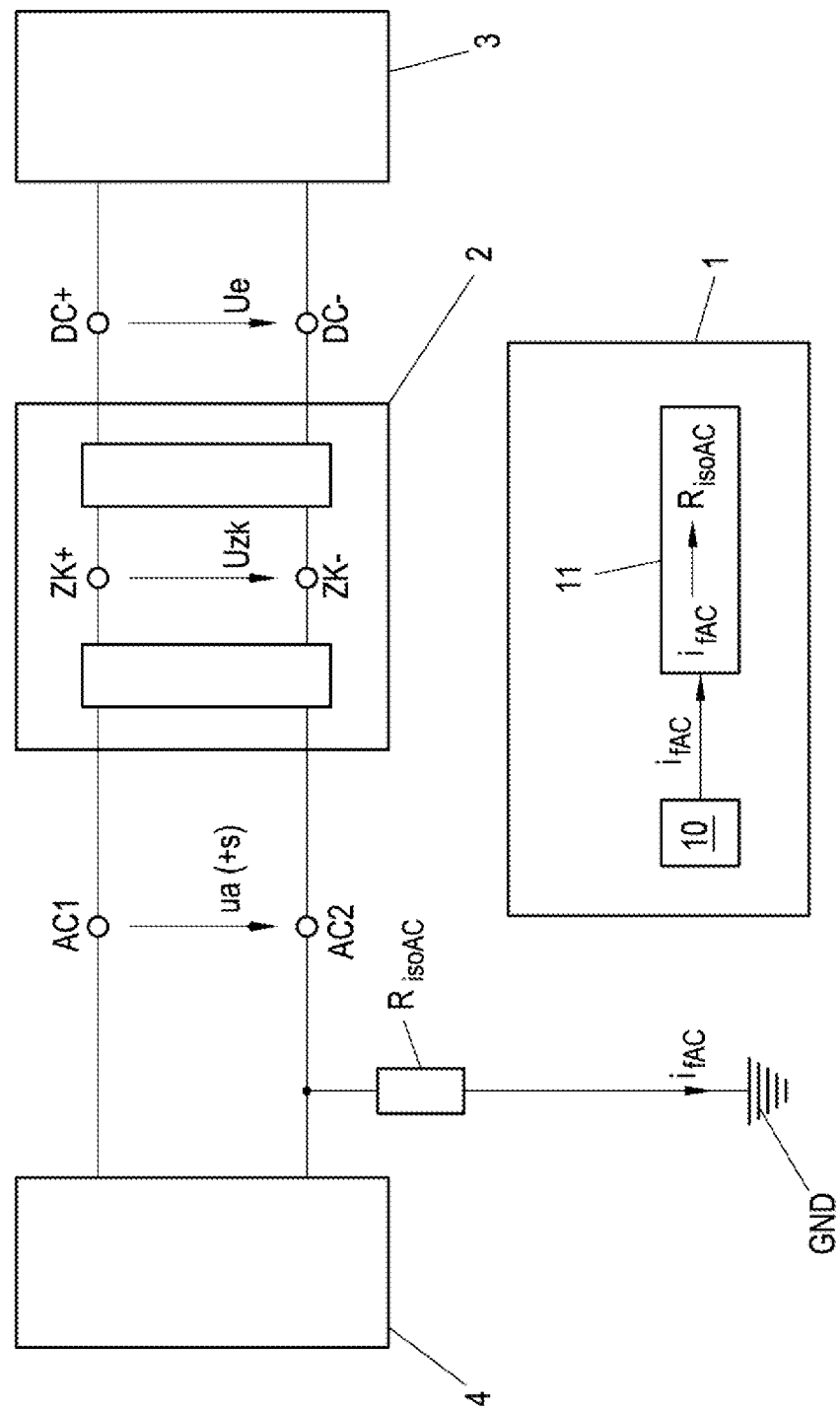

| | | | |
|---|---|---|---|
| 9,069,025 | B2 | 6/2015 | Schaefer et al. |
| 9,274,159 | B2 | 3/2016 | Wang |
| 9,645,185 | B2 | 5/2017 | Bagchi et al. |
| 9,768,610 | B2 * | 9/2017 | Bieniek ................. G01R 19/10 |
| 11,391,785 | B2 | 7/2022 | Hackl |
| 2012/0126839 | A1 | 5/2012 | Schaefer et al. |
| 2013/0021038 | A1 * | 1/2013 | Tago .................... B60L 3/0069 |
| | | | 324/510 |
| 2013/0106437 | A1 * | 5/2013 | Herraiz ................. G01R 31/11 |
| | | | 324/615 |
| 2013/0221997 | A1 * | 8/2013 | Garcia Alvarrez .... G01R 31/14 |
| | | | 324/709 |
| 2014/0306544 | A1 * | 10/2014 | Hantschel ............... H02J 3/381 |
| | | | 363/71 |
| 2015/0022217 | A1 | 1/2015 | Wang |
| 2016/0258993 | A1 | 9/2016 | Bagchi et al. |
| 2020/0081072 | A1 | 3/2020 | Hackl |

FOREIGN PATENT DOCUMENTS

| | | |
|---|---|---|
| EP | 2 256 506 | 12/2010 |
| EP | 3 620 800 | 3/2020 |

OTHER PUBLICATIONS

Int'l Written Opinion (Form PCT/ISA/237) conducted in Int'l Appln. No. PCT/EP2021/082950 (Mar. 4, 2022).

Europe Search Report/Office Action conducted in counterpart Europe Appln. No. 20210023.6 (May 26, 2021).

\* cited by examiner

MONITORING DEVICE FOR EMERGENCY STANDBY OPERATION

The present invention relates to a method for determining an AC insulation resistance between the AC connections of an inverter and a ground potential, wherein a DC voltage is applied at DC connections of the inverter, and an AC voltage is applied between AC connections of the inverter, wherein the DC connections are connected to a DC power source, and wherein, in an emergency standby operation, the AC connections are connected to an AC energy sink in order to transmit energy from the DC energy source to the AC energy sink. Furthermore, the present invention relates to a monitoring device for determining an AC insulation resistance between AC connections of the inverter and a ground potential, wherein DC connections of the inverter can be connected to a DC power source, and, in an emergency standby operation. AC connections of the inverter can be connected to an AC energy sink and to an inverter with a monitoring unit.

A power inverter—also called inverter—represents a direct current/alternating current converter and therefore converts an input DC voltage (DC voltage) present at an input side between DC connections into one or more output alternating voltages (AC voltage) present at an output side between AC connections. The DC connections of the inverter are connected to a DC voltage power source (DC power source)—for example, a photovoltaic system in generator mode. The DC power source provides the DC voltage and supplies the inverter with energy. In mains operation, the AC connections of the inverter are connected to an energy supply network in order to feed the energy made available by the DC power source into the energy supply network. The AC voltages are advantageously synchronized to the mains voltages of the energy supply network. If the inverter is, for example, three-phase, one AC connection is provided per phase, and each AC connection is connected to a network phase of the power supply network, wherein a neutral conductor can also be led out as an AC connection.

In emergency standby operation, however, the AC connections of the inverter are separated from the energy supply network and instead connected to an alternating voltage energy sink (AC energy sink), whereby the energy provided by the DC power source is output by the inverter to the AC energy sink. The AC connections are disconnected at all poles from the energy supply network, which can be done both internally in the inverter and externally. In emergency standby operation, it is also possible to operate a polyphase inverter in single-phase operation. In order to implement single-phase operation, it is possible, for example, to operate only two of the three phase branches, wherein the single-phase output alternating voltage is output between two of the four AC connections (three phases and one neutral conductor).

A mains protection device is provided in the energy supply network, wherein fault current circuit breakers, fuses, etc., can be provided. Since the mains protection device is arranged on the mains side, it is effective only in mains operation, but not in emergency standby operation, since all AC connections are disconnected from the energy supply network.

Accordingly, in many cases, it is necessary for inverters to provide protective devices which protect the inverter and, in particular, the AC connections thereof in emergency standby operation, and/or monitor whether, in the context of mains operation, protection devices of the energy supply network cannot be accessed. In this regard, the prior art reveals considerations that are only partially suitable.

DE 102014109513 A1 accordingly describes a method and a device for monitoring an electric power circuit which, however, is a component of a vehicle and not an inverter. The particulars of inverters are therefore not discussed in DE 102014109513 A1.

Furthermore, the subject of DE 102016103883 A1 is a DC bus leakage current detection for a DC bus in an electric vehicle. By definition, DE 102016103883 A1 deals with DC quantities, which, however, does not include a consideration of AC connections.

EP 2256506 A1 and EP 3620800 A1 also disclose approaches for monitoring entire non-isolated power grids, which can also be transmitted only to a limited extent to an isolated system consisting of an inverter and an AC sink.

It is therefore an object of the present invention to present a protective device for an inverter which is functional in emergency standby operation.

This object is achieved according to the invention by performing an insulation test in emergency standby operation, wherein an AC fault current flowing between an AC connection and the ground potential is determined, and the AC insulation resistance is calculated from the AC fault current.

In a preferred manner, an electrical voltage of the inverter corresponding to the AC insulation resistance can be used to calculate the AC insulation resistance, and the AC insulation resistance can be calculated from the AC fault current and the electrical voltage corresponding to the AC insulation resistance, as is sufficiently known from electrical engineering. Such an electrical voltage can, as described above, be an output alternating voltage (AC voltage) present at an output side between AC connections of the inverter, "Corresponding to the AC insulation resistance" is to be understood in such a way that the mentioned electrical voltage allows the calculation of the AC insulation resistance.

In addition to an AC voltage present in an output side between AC connections of an inverter, an electrical voltage can also be used to calculate the AC insulation resistance, which electrical voltage is related to such an AC voltage between AC connections of an inverter, for example, in the sense that the AC voltage, which is between the AC connections of the inverter, can be determined from this electrical voltage. This can, for example, be an electrical voltage dropping between an AC connection of an inverter and the ground potential. If the electrical voltage used for calculating the AC insulation resistance drops over the AC insulation resistance, in the simplest case, Ohm's law can be used for calculating the AC insulation resistance from the AC fault current and the corresponding electrical voltage.

Furthermore, the object is achieved by a monitoring device which comprises a fault current detection unit which is designed to determine an AC fault current flowing between an AC connection and a ground potential, wherein the monitoring device further comprises a calculation unit which is designed to calculate, using the AC fault current, an AC insulation resistance. In a preferred manner, in accordance with the above embodiments, the calculation unit can use an electrical voltage such as an AC voltage, so that the AC insulation resistance is calculated from the AC fault current and the AC voltage. It is therefore possible to monitor the AC insulation resistance during ongoing operation of the inverter. In this case, the AC fault current is used which arises when the AC insulation resistance between an AC connection and the ground potential is low, i.e., an AC insulation fault is present. If there is no insulation fault in the inverter, a high AC insulation resistance between the AC connection and the ground potential exists, whereby only a small and negligible AC fault current flows between the AC connection and the ground potential. It can be assumed that the AC insulation resistance tends to infinity. However, if an insulation fault occurs, the AC insulation resistance is low, and a high AC fault current flows between the AC connection and the ground potential. An insulation fault, i.e., a reduced AC insulation resistance, can therefore be identified by the determined AC fault current.

The monitoring unit can be designed as an integral component of the inverter, or also separately. The inverter and the AC energy sink form an IT (Isolé Terre) system in emergency standby operation (also called island operation). An IT system is not grounded, whereby, in contrast to a TN network at the AC connection, a fault current circuit breaker and/or a residual current measuring unit are omitted in order to save on costs. According to the invention, in emergency standby operation, the AC insulation resistance between an AC connection and the ground potential is actively monitored. Passive measuring principles are, by contrast, disadvantageous, since symmetrical faults cannot be detected on an AC connection, or insulation faults cannot be detected on a DC connection. If, for example, a phase and the neutral conductor were to have the same insulation fault against the ground potential in a single-phase emergency standby operation, a passive voltage measurement of this phase against the ground potential and the potential of the neutral conductor according to the prior art could not determine the fault, since there would be no shift.

According to the invention, the AC fault current is calculated from an insulation voltage, present between an intermediate circuit connection and the ground potential, which can be determined by means of a voltage measuring unit, and from an insulation impedance located between the one intermediate circuit connection and the ground potential. The insulation impedance can be known in advance. The AC fault current can also be calculated from an insulation voltage present between an intermediate circuit midpoint of the inverter and the ground potential and from an insulation impedance between the intermediate circuit midpoint and the ground potential. Depending upon the design of the inverter, a neutral conductor can also be connected directly to the intermediate circuit center midpoint of the inverter. The insulation voltage can comprise both DC components and AC voltage components.

For this purpose, the fault current detection unit can be configured to calculate the AC fault current from an insulation voltage, which is present between an intermediate circuit connection and a ground potential or between an intermediate circuit midpoint and the ground potential, and from an insulation impedance which is between the intermediate circuit connection and the ground potential or between an intermediate circuit midpoint and the ground potential.

The insulation test can be repeated several times, preferably cyclically, with a test cycle rate, particularly preferably with a test cycle rate in the range of seconds. It is therefore possible to check with the test cycle rate whether an AC fault current is flowing, and to infer an insulation fault.

A voltage measuring unit is preferably provided which is designed to measure an insulation voltage present between an intermediate circuit connection and the ground potential or between the intermediate circuit midpoint and the ground potential, wherein the fault current detection unit is configured to calculate the AC fault current from the insulation voltage and an insulation impedance between the intermediate circuit connection and the ground potential, or between the intermediate circuit midpoint and the ground potential.

The insulation impedance can be approximated by a parasitic DC capacitance, e.g., a DC-side capacitance of a PV generator, or by a parasitic DC capacitance and a parallel. DC insulation resistance.

Advantageously, a test signal with a test frequency greater than an AC frequency of the AC voltage is applied to the AC voltage during the, preferably entire, insulation test. Advantageously, the test signal has an amplitude of at most 120V. A fault current threshold of 10 mA and/or an AC insulation resistance threshold of 50 OhmsNolt can be provided. If no test signal is provided, the AC frequency of the AC voltage can be used for the insulation test.

Preferably, a signal is output within 10 seconds after the occurrence of an insulation fault, e.g., in the form of a visual display that cannot be acknowledged.

When a fault current threshold is exceeded by the AC fault current and/or when an insulation resistance threshold of the AC insulation resistance is exceeded, the inverter can be switched to a fault current operation and/or at least partially switched off. The insulation resistance threshold can be selected such that the AC insulation resistance lies within a standardized range. In a conventional IT system, an insulation fault detected once does not cause a disconnection; however, an immediate shutdown can be considered with respect to an inverter.

A DC insulation fault is preferably detected by connecting a high-ohmic resistor between one of the intermediate circuit connections and the ground potential, and determining a DC voltage component of the insulation voltage between one of the intermediate circuit connections and the ground potential before and after the connecting the high-ohmic resistor. The ratio of the determined DC voltage components of the insulation voltages to one another provides information on the level of the insulation resistance. The higher the insulation resistance, the more strongly the potential at the intermediate circuit connection is shifted against the ground potential by connecting the high-ohmic resistor. Thus, for example, by means of the voltage measuring unit, the insulation voltage can be determined before and after closing the circuit breaker, and a DC insulation fault occurring at arbitrary locations can be detected from the measured values of the insulation voltage obtained thereby. Preferably, such a detection of a DC insulation fault is performed not only before the inverter is switched on, but during the ongoing emergency standby operation. It is particularly advantageous to determine a DC insulation fault if the inverter does not have any galvanic isolation between the AC connections and the DC connections. An overall insulation resistance is therefore composed of an AC insulation resistance and a DC insulation resistance.

A DC insulation resistance occurring between an intermediate circuit connection and the ground potential can also be measured by means of a DC fault current measuring unit, wherein a residual current monitoring unit (RCMU) can be used. A residual current measuring unit determines a total current via the intermediate circuit connections and therefore functions according to the operating principle of a fault current circuit breaker. In principle, a residual current measuring unit can be used to detect DC insulation faults, but only if DC fault currents flow between the intermediate circuit connections and the ground potential. However, if DC insulation faults occur at a location which is at ground potential when there are no faults, a DC fault current does not flow, which means that the DC insulation fault cannot be detected using a residual current measuring unit.

A mains operation of the inverter can be provided, wherein the AC connections of the inverter are separated from the AC energy sink and/or connected to an energy supply network in order to transmit energy from the DC energy source to the energy supply network while switching from emergency standby operation to mains operation. In mains operation, the insulation test is preferably not run. This is particularly advantageous if protective measures, such as fault current protection devices, overcurrent protection devices, etc., are already implemented in the energy supply network.

Figure 2:
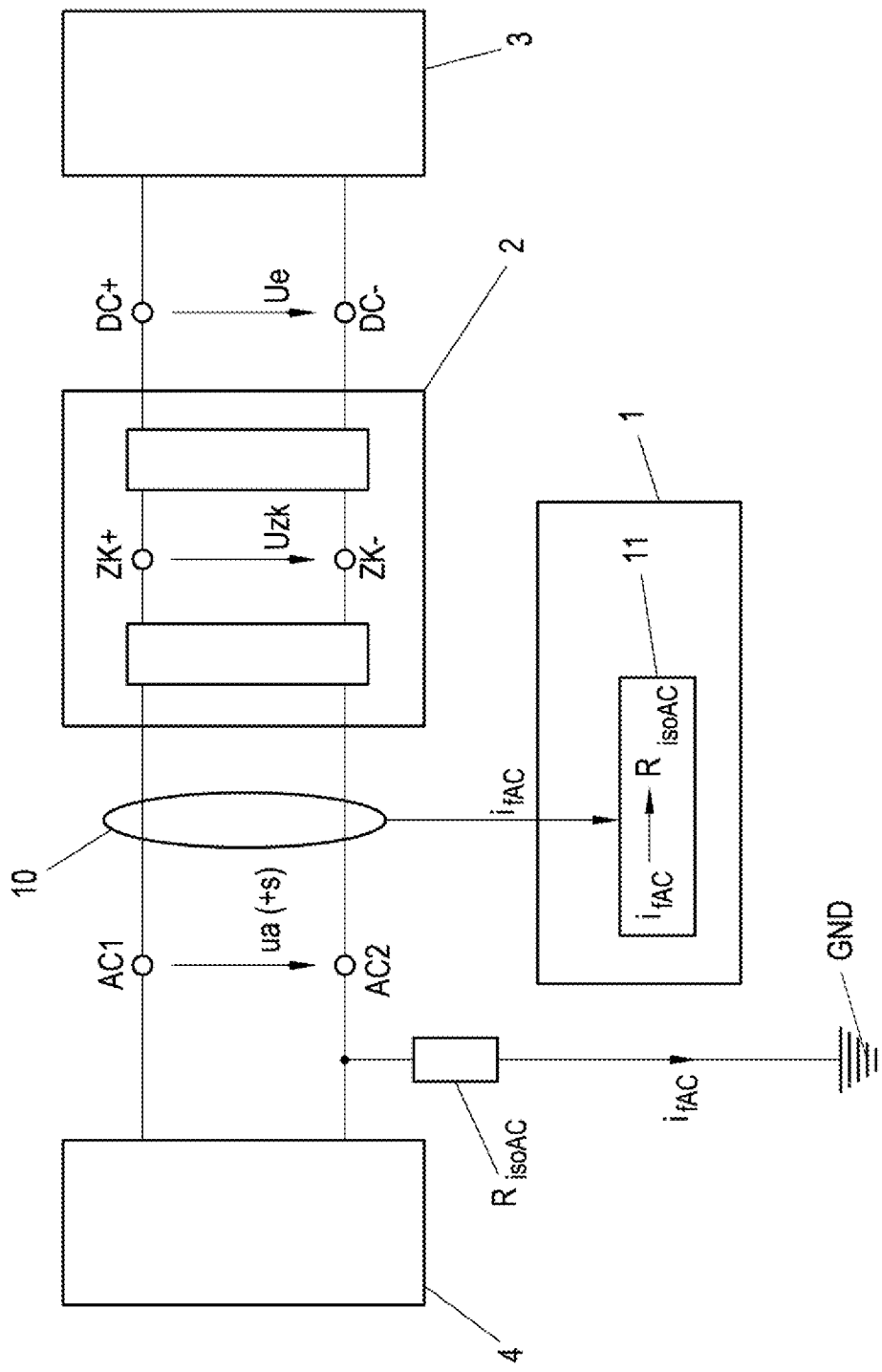
Figure 3:
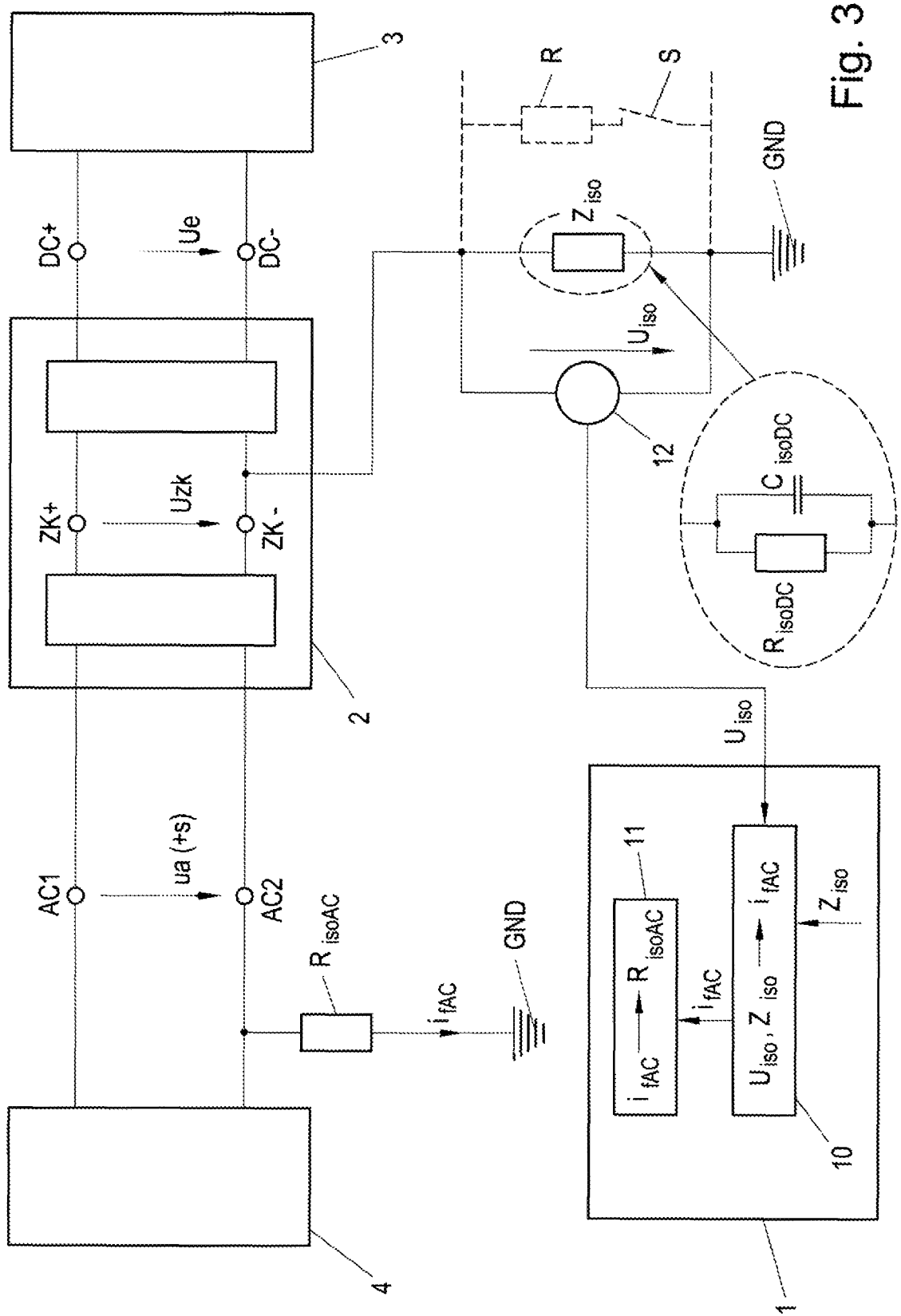
Figure 4:
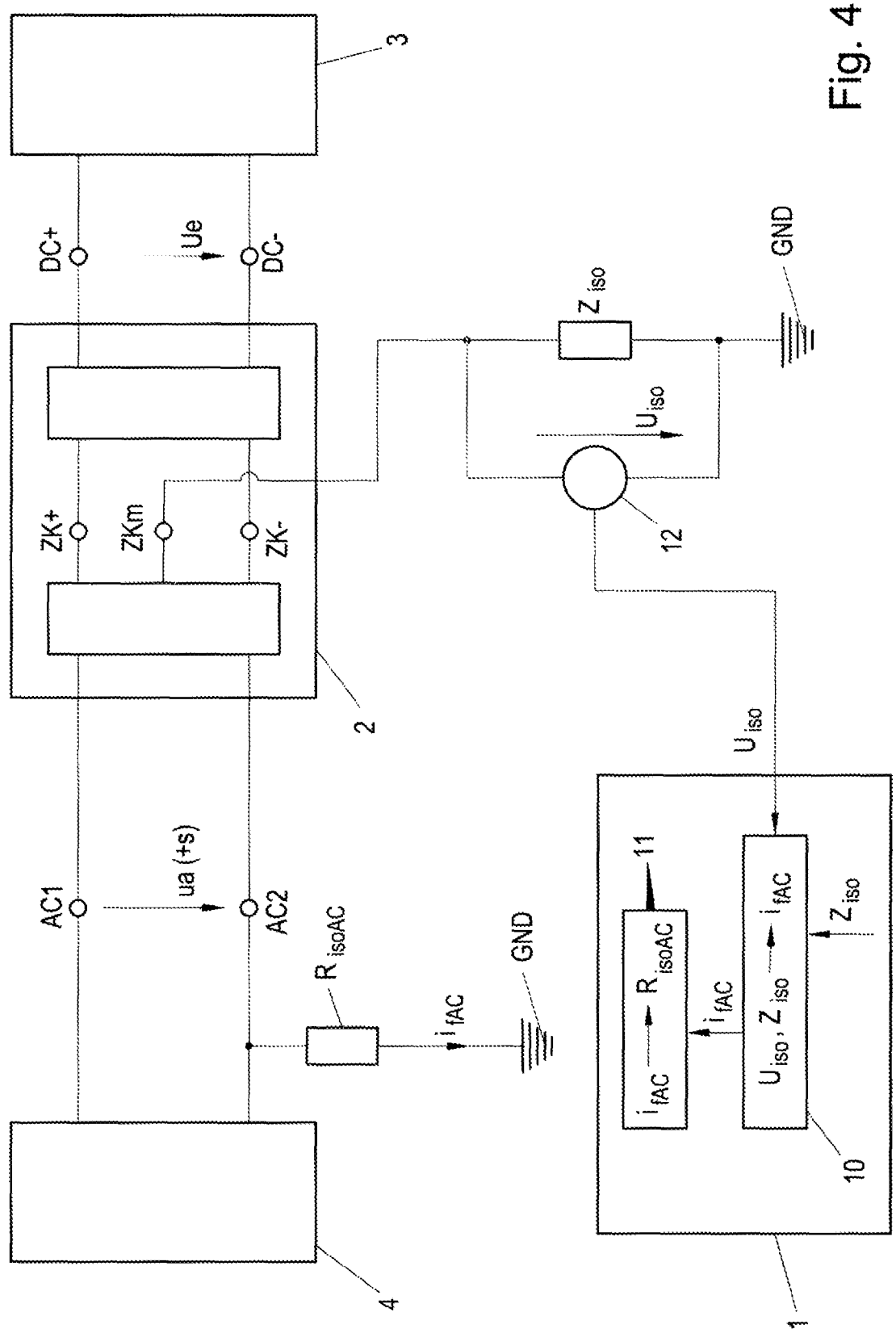
Figure 5A:
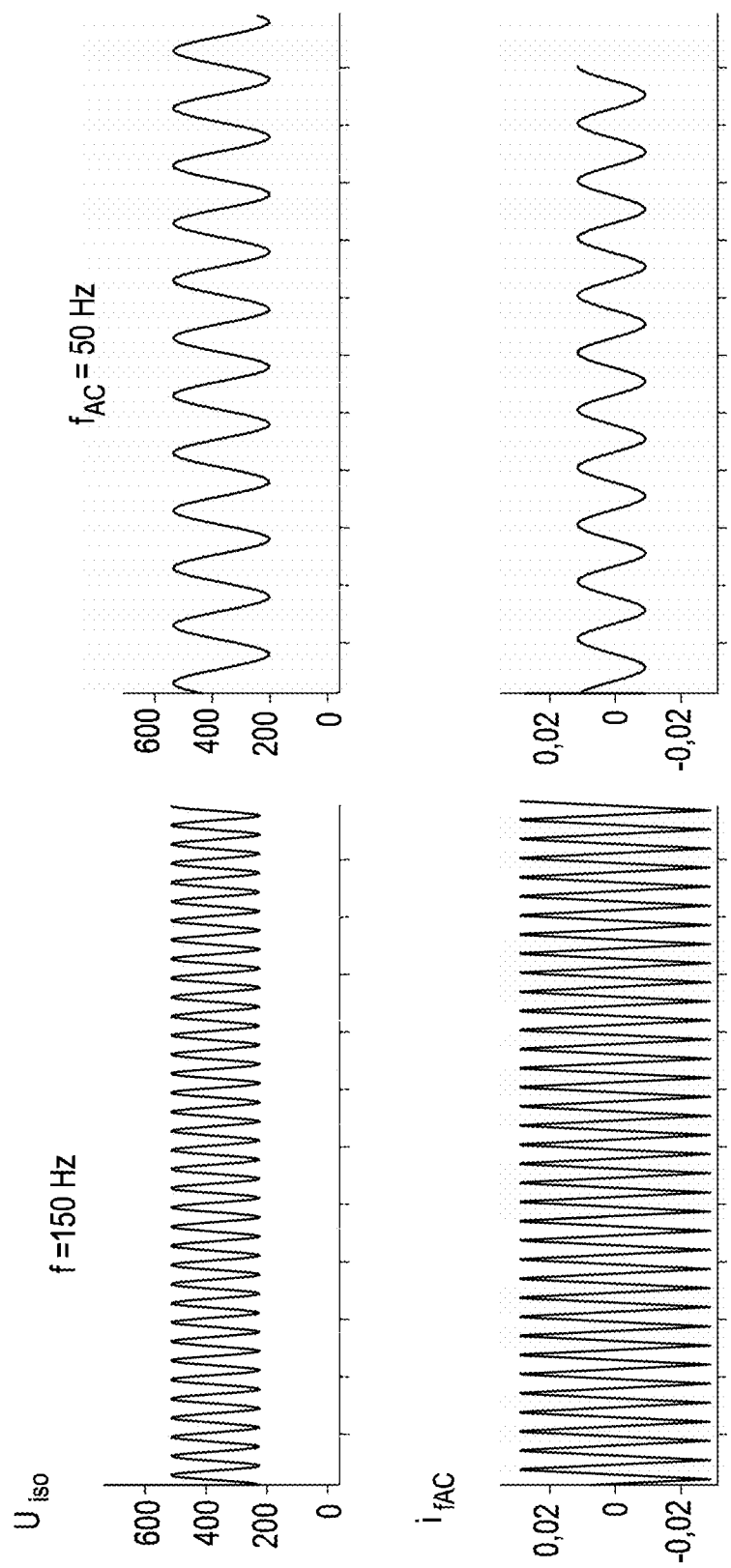
Figure 5B:
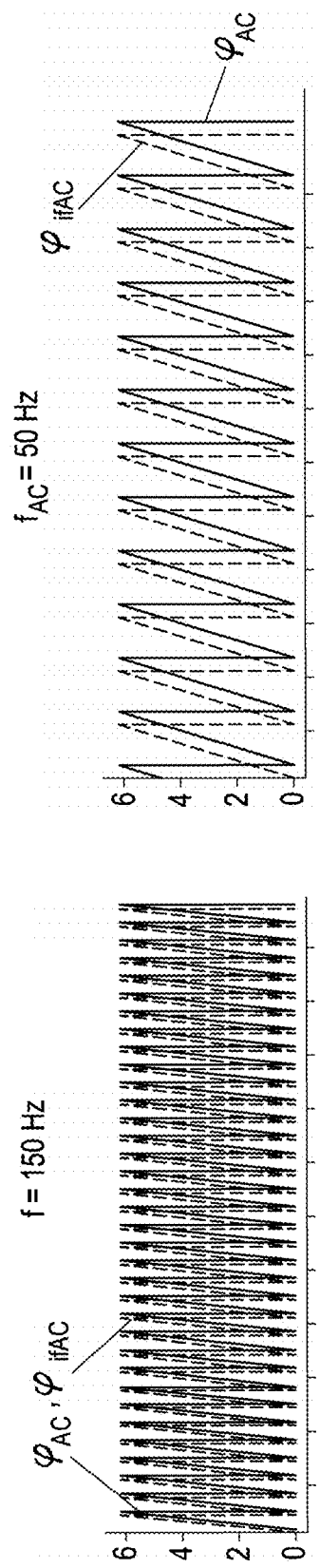

The present invention is described in greater detail below with reference to FIGS. 1 through 5, which show schematic and non-limiting advantageous embodiments of the invention by way of example. The following are shown:

FIG. 1 an arrangement consisting of an inverter, an AC energy sink, a DC energy source, and a monitoring device, FIG. 2 the arrangement with a fault current detection unit as a fault current measuring unit, FIG. 3 the arrangement with a voltage measuring unit for measuring an insulation voltage at an insulation impedance, FIG. 4 an alternative arrangement for measuring an insulation impedance, FIGS. 5A and 5B waveforms of an AC frequency, a test frequency, and associated fault currents, phase angles, AC voltages, fault current phase angles, and insulation resistances.

FIG. 1 shows an arrangement consisting of an inverter 2, an AC energy sink 4, and a DC energy source 3. AC connections AC1, AC2 of the inverter 2 are connected to the AC energy sink 4, and DC connections DC+, DC− of the inverter 2 are connected to the DC power source 3. The AC connections AC1, AC2 can represent, for example, two phases of the inverter 2. The inverter 2 further comprises an optional intermediate circuit with intermediate circuit connections ZK+, ZK−, between which a DC intermediate circuit voltage Uzk is present.

It is also possible to connect an inverter 2, which is fundamentally multi-phase, e.g., three-phase, to a two-phase AC energy sink 4, wherein two of the three phases of the inverter 2 are connected to the AC energy sink 4. A multi-phase, e.g., three-phase, AC energy sink 4 can also be connected to the AC connections of the inverter 2, wherein several, e.g., three, AC connections are each formed by the phases of the inverter 2.

The inverter 2 converts a DC input voltage Ue, provided by the DC power source 3, via the DC intermediate circuit voltage ZK+, ZK− into an AC voltage ua, which in turn is made available to the AC energy sink 4. In this way, energy is transmitted from the DC energy source 3 to the AC energy sink 4. The DC voltage Ue is present between the DC connections DC+, DC−, and the AC voltage ua is present between the AC connections AC1, AC2. An electric machine or another electrical consumer, for example, can be provided as an AC energy sink 4. For example, batteries/storage batteries and/or photovoltaic cells can be provided as a DC energy source 3.

Filter capacitors and/or filter inductors can be provided in each case at the DC connections DC+, DC−, and also at the AC connections AC1, AC2 (not shown in the figures).

The inverter 4 can also be designed to be bidirectional, which means that an AC voltage ua applied to the AC connections AC1, AC2 can also be converted to the DC intermediate circuit voltage ZK+, ZK− and further to the DC input voltage Ue applied to the DC connections DC+, DC−. In this way, energy can also be transported from the AC connections AC1, AC2 to the intermediate circuit, which is connected, for example, to a current storage/battery which directly consumes PV current. A bidirectional inverter 2 is also referred to as a hybrid inverter. Therefore, consumers can also be supplied with separate AC connections, i.e., for example, from the current storage/battery. The AC connections can be opened by means of an AC isolator so that the inverter 2 is disconnected from the energy supply network.

In the figures, the inverter 2 is therefore in an emergency standby operation NE, since the AC isolator is open, which is why, for simplification, the energy supply network and the AC isolator are not shown. If the inverter 2 is switched to mains operation (not shown), then the AC connections AC1, AC2 are connected to the mains phases of an energy supply network (closed AC isolator), and the AC energy sink 4 can be disconnected. If the inverter 2 is switched back into emergency standby operation NE, the AC connections AC1, AC2 are disconnected from the mains phases of the energy supply network and connected to the AC energy sink 4. The energy sink 4 can, for example, be at least one socket, integrated into the inverter 2, at which at least one consumer can be connected and supplied.

In such an embodiment, the inverter 2 can therefore supply, for example, those consumers in emergency standby operation NE which are connected to the integrated socket. All other consumers can be separated by an AC isolator.

In a further embodiment, it is also possible for the integrated socket to be supplied by the energy supply network even during mains operation. In this case, the AC energy sink can nevertheless be disconnected in the circuitry and can be bridged, so to speak, with a connection to the power supply network.

In emergency standby operation NE, network protection devices do not affect the energy supply network, since the inverter 2 is separated from the energy supply network and therefore also from the mains protection devices. Instead, an IT system, in conjunction with the AC energy sink 4, is present, which is not connected to a ground potential GND by definition. An AC insulation resistance $R_{isoAC}$ is present between the AC connections AC1, AC2 of the inverter 2 and the ground potential GND, wherein, according to the invention, a monitoring device 1 for determining the ohmic AC insulation resistance $R_{isoAC}$ is provided. The monitoring device 1 comprises a fault current detection unit 10 which is designed, for performing an insulation test I, to determine an AC fault current $i_{fAC}$ flowing between an AC connection AC1, AC2 and a ground potential GND. A calculation unit 11 calculates, using the AC fault current $i_{fAC}$, the AC insulation resistance $R_{isoAC}$, The "AC" in the AC insulation resistance $R_{isoAC}$ relates to the AC side of the inverter 2, at which the AC insulation resistance $R_{isoAC}$ occurs.

If no insulation fault occurs in the inverter 2, the AC insulation resistance $R_{isoAC}$ is high. However, if an insulation fault occurs in the inverter 2, the AC insulation resistance $R_{isoAC}$ decreases. If an insulation fault occurs, the AC insulation resistance $R_{isoAC}$ is low.

If the fault current detection unit 10 is designed as a fault current measuring unit, as shown in FIG. 2, the AC fault current $i_{fAC}$ can be measured directly to perform the insulation test I. The fault current measuring unit 10 can be a residual current measuring unit (RCMU), which encloses the AC connections AC1, AC2 and measures a sum current.

Accordingly, the fault current detection unit 10 and the calculation unit 11 can be connected to a control unit (not shown) of the inverter, which is designed to control the fault current detection unit 10 and the calculation unit 11.

Alternatively or additionally, the fault current detection unit 10 can be configured to calculate the AC fault current $i_{fAC}$ for performing the insulation test I. For this purpose, an AC voltage component of an insulation voltage $U_{iso}$ can be determined between one of the intermediate circuit connections ZK+, ZK− and a ground potential GND, as shown in FIG. 3. In conjunction with a known insulation impedance $Z_{iso}$ which is present between one of the intermediate circuit connections ZK+, ZK− and the ground potential GND, the AC fault current $i_{fAC}$ can be calculated in the fault current detection unit 10. The AC insulation resistance $R_{isoAC}$ can then be correspondingly calculated from the AC fault current $i_{fAC}$. Particularly in multi-phase inverters 2, an AC voltage component of the insulation voltage $U_{iso}$ can also be determined between an intermediate circuit midpoint ZKm and a ground potential GND, as shown in FIG. 4. The AC fault current $i_{fAC}$ can be calculated as described above with respect to FIG. 3. The insulation voltage $U_{iso}$ can be determined using a voltage measuring unit 12, as shown in FIGS. 3 and 4. The voltage measuring unit 12 preferably measures both a DC voltage component and an AC voltage component of the insulation voltage $U_{iso}$.

Preferably, during the, preferably entire, insulation test I, a test signal s with a test frequency f greater than an AC frequency $f_{AC}$ of the AC voltage ua is modulated onto the AC voltage ua, which is indicated in FIGS. 1 through 4 by "ua (+s)". To generate the test signal, a test signal generator can be provided; to modulate the test signal onto the AC voltage ua, a test signal coupling unit can be provided.

The insulation impedance $Z_{iso}$ is preferably approximated by a known parasitic DC capacitance $C_{isoDC}$—for example, a DC-side capacitance of a DC voltage source (e.g., a PV generator). The DC capacitance $C_{isoDC}$ can be required for other routines in the inverter 2 and, accordingly, preferably be determined continuously. In this case, the already determined DC capacitance $C_{isoDC}$ can be used for the calculation of the AC fault current $i_{fAC}$. It can be assumed that the insulation impedance $Z_{iso}$ approximately corresponds to the reactance $X_C$ which is formed by the parasitic DC capacitance $C_{isoDC}$ at the AC frequency $f_{AC}$ of the AC voltage, or when using a test signal s at a test frequency f of the test signal s. It is also possible to approach the insulation impedance $Z_{iso}$ by a known parasitic DC capacitance $C_{isoDC}$ and a parallel ohmic DC insulation resistance $R_{isoDC}$, as indicated in FIG. 3. The "DC" in the DC insulation resistance $R_{isoDC}$ and in DC capacitance $C_{isoDC}$ relates to the DC side of the inverter 2 at which the DC insulation resistance $R_{isoDC}$ and DC capacitance $C_{isoDC}$ occurs. Especially with a small ohmic DC insulation $R_{isoDC}$ of the insulation impedance $Z_{iso}$, the insulation impedance $Z_{iso}$ can again be approximated by the reactance $X_C$, because, if the DC insulation resistance $R_{isoDC}$ is low, it can already be assumed that a DC insulation fault exists, which means that a calculation of the AC insulation resistance $R_{isoAC}$ can be omitted.

In both cases, the magnitude and the phase angle of the AC fault current $i_{fAC}$ can be calculated directly from the quotient $i_{fAC}=U_{iso}/Z_{iso}$ (at the AC frequency $f_{AC}$ or, if a test signal s is used, at the test frequency f of the test signal s). To calculate the AC fault current $i_{fAC}$, an alternating voltage component of the insulation voltage $U_{iso}$ is preferably used at the AC frequency $f_{AC}$ or, if a test signal s is used, at the test frequency f of a test signal s.

Regardless of whether the AC fault current is measured according to FIG. 2 or is calculated according to FIG. 1, FIG. 3, and/or FIG. 4, the AC fault current $i_{fAC}$ serves as the input for the calculation unit 11, which calculates the AC insulation resistance $R_{isoAC}$. For this purpose, the following steps can be provided:

In a next step, the phase shift $\Delta\varphi$ between the AC phase angle $\varphi_{AC}$ of the AC voltage ua (or of the test signal s) and the fault current phase angle $\varphi_{ifAC}$ of the AC fault current $i_{fAC}$ is calculated: $\Delta\varphi=\varphi_{AC}-\varphi_{ifAC}$. The phase shift $\Delta\varphi$ is therefore the distance of the zero crossings between the AC voltage ua (or of the test signal s) and the AC fault current $i_{fAC}$. If a test signal s is superimposed on the AC voltage ua, then the component with the test frequency f of the test signal s is relevant from the resulting voltage ua+s.

From the known relationship $\tan(\varphi[Z])=Im[Z]/Re[Z]$ (Z corresponds to $Z_{iso}$), as mentioned above, when the DC insulation resistance $R_{isoDC}$ is high, the approximate equation $\tan(\Delta\varphi)=R_{isoAC}/X_C$ can be formed, which then can be solved for $R_{isoAC}$, which allows the AC insulation resistance $R_{isoAC}$ to be calculated.

In this case, the AC insulation resistance $R_{isoAC}$ is preferably calculated cyclically, for example, in the range of seconds.

To calculate the AC insulation resistance $R_{isoAC}$, a test signal s with a test frequency f can also be used. The test frequency f, which is superimposed/modulated onto the AC frequency $f_{AC}$, can correspond to the AC frequency $f_{AC}$ of the AC voltage ua, or preferably a higher frequency. The test signal s is preferably continuously present during the insulation test I.

FIGS. 5A and 5B contrast the measured values for an insulation test using the AC frequency $f_{AC}$ of 50 Hz (right) and using a test frequency f of 150 Hz (left).

The top graph shows an AC voltage component of the insulation voltage $U_{iso}$ with the AC frequency $f_{AC}$ and the test frequency; in the graph underneath, the AC fault current $i_{fAC}$ with the AC frequency $f_{AC}$ and the test frequency f can be seen. It is apparent that the fault current $i_{fAC}$ (or its amplitude), when using a test signal s with a test frequency f greater than the AC frequency $f_{AC}$ (i.e., in this case, 150 Hz>50 Hz), is higher than the fault current $i_{fAC}$ when using the AC frequency $f_{AC}$.

Furthermore, FIG. 5B shows on the left the AC phase angle $\varphi_{AC}$ of the test signal s and the associated fault current phase angle $\varphi_{ifAC}$ (dashed), and FIG. 5B on the right shows the AC phase angle $\varphi_{ifAC}$ of the AC voltage and the associated fault current phase angle (dashed) $\varphi_{ifAC}$. It is therefore apparent that the fault current phase angle $\varphi_{ifAC}$ at the AC frequency f differs from the fault current phase angle $\varphi_{ifAC}$ at the test frequency f. During an insulation test I, an AC insulation resistance $R_{isoAC}$ is calculated, which is preferably repeated cyclically with a test cycle rate. The test cycle rate may be in the range of seconds, and may, for example, be 1 to 5, preferably 3, seconds, which means that the insulation test I is repeated every 1 to 5, preferably every 3, seconds. An AC insulation fault exists if the AC insulation resistance $R_{isoAC}$, calculated from the phase shift $\Delta\varphi$ between the AC phase angle $\varphi_{AC}$ of the AC voltage ua (or the test signal s) and the fault current phase angle $\varphi_{ifAC}$, is under a predetermined insulation resistance threshold.

Since the reactance $X_C$ of the DC capacitance $C_{isoDC}$ rises with the frequency, the AC fault current $i_{fAC}$ also rises with rising frequency (see FIG. 5B, $i_{fAC}$), which allows an influence by a possibly fluctuating parasitic DC capacitance $C_{isoDC}$ to be compensated for. The measurement of an AC voltage component of the insulation voltage $U_{iso}$ is not affected at all or only slightly by an increased frequency (which is shown here with the test frequency f=150 Hz compared to the AC frequency f) since, although the current rises, the reactance $X_C$ falls to the same extent.

Since the inverter 4 does not have any galvanic isolation between the AC connections and the DC connections, a DC insulation fault can also be detected. This can be done by the fault current detection unit 10 (for example, a residual current measuring unit (RCMU) according to FIG. 2), which measures both an AC voltage component and the DC voltage component of the fault current $i_{fAC}$. A residual current measuring unit is particularly suitable for detecting suddenly occurring DC insulation faults.

In general, however, a DC insulation fault can also be detected by connecting a high-ohmic resistor R between one of the intermediate circuit connections ZK+, ZK− and the ground potential GND by means of a test switch S, as shown in dashed lines in FIG. 3 and also valid for the variant according to FIG. 4. The test switch S can be controlled by the monitoring device 1.

A DC insulation fault can be detected by connecting a high-ohmic resistor R between one of the intermediate circuit connections ZK−, ZK+ and the ground potential GND, and determining a DC voltage component of the insulation voltage $U_{iso}$ between one of the intermediate circuit connections ZK+, ZK− and the ground potential GND before and after connecting the high-ohmic resistor R. The ratio of these two direct current components to one another allows a conclusion to be drawn regarding the level of insulation resistance $R_{isoDC}$. The higher the insulation resistance $R_{isoDC}$, the more strongly the potential at the intermediate circuit connection ZK+, ZK− is shifted against the ground potential GND by connecting the high-ohmic resistor R. The greater the ratio of the insulation voltages $U_{iso}$ to each other, the greater the DC insulation resistance $R_{isoDC}$.

In order to achieve a sufficient speed and current strength in the variant according to FIG. 2, it is advantageous if a switch provided in the residual current fault current detector is replaced or supplemented by a semiconductor switch to realize the test switch S. In all variants, a DC voltage component of the insulation voltage $U_{iso}$ is determined between one of the intermediate circuit connections ZK+, ZK− and the ground potential GND before and after connecting the high-ohmic resistor R.

For combined insulation monitoring of DC insulation faults and AC insulation faults, the following sequence of a routine can now preferably be used:
1. Check whether there is a DC insulation fault.
2. If there is a DC insulation fault, repeat the check.
3. If there is no DC insulation fault, switch the inverter 2 to mains operation or emergency standby operation.
4. Check whether there is a DC or AC insulation fault. This is done in a cyclical/serial manner with the test cycle rate, according to the previously described operations.

Step 4 can be provided if, according to a specification, AC and DC insulation faults must be checked continuously during emergency standby operation in the IT network. When an AC or DC insulation fault is detected, i.e., an excessively low AC insulation resistance and/or DC insulation resistance $R_{isoDC}$, the inverter 2 can accordingly be switched off.

The invention claimed is:

1. A method for determining an AC insulation resistance between the AC connections of an inverter and a ground potential, comprising:
    applying a DC voltage between DC connections of the inverter; and
    applying an AC voltage between the AC connections of the inverter,
    wherein the DC connections are connected to a DC power source,
    wherein, in an emergency standby operation, the AC connections are connected to an AC energy sink in order to transmit energy from the DC energy source to the AC energy sink, and an insulation test is performed,
    wherein an AC fault current flowing between an AC connection and the ground potential is determined from an insulation voltage present between one of intermediate circuit connections and the ground potential or an intermediate circuit midpoint and the ground potential, and from an insulation impedance between the intermediate circuit connection and the ground potential or the intermediate circuit midpoint and the ground potential,
    wherein a phase shift between an AC phase angle of the AC voltage and a fault current phase angle of the AC fault current is calculated, and
    wherein the AC insulation resistance is calculated from the phase shift.

2. The method according to claim 1, wherein the insulation test is repeated several times with a test cycle rate.

3. The method according to claim 2, wherein the insulation test is repeated cyclically.

4. The method according to claim 3, wherein the insulation test is repeated cyclically with a test cycle rate in a range of seconds.

5. The method according to claim 1, wherein the insulation impedance is approximated by a parasitic DC capacitance or by a parasitic DC capacitance and a parallel DC insulation resistance.

6. The method according to claim 1, wherein, during the insulation test, a test signal with a test frequency greater than an AC frequency of the AC voltage is modulated onto the AC voltage.

7. The method according to claim 1, wherein, when a fault current threshold is exceeded by the AC fault current and/or when an insulation resistance threshold of the AC insulation resistance is undershot, the inverter is switched to a fault current operation and/or at least partially switched off.

8. The method according to claim 1, wherein a mains operation of the inverter is provided, wherein, while switching from emergency standby operation to mains operation, the AC connections of the inverter are separated from the AC energy sink and/or connected to an energy supply network in order to transmit energy from the DC energy source to the energy supply network, and that wherein the insulation test is not run during mains operation.

9. The method according to claim 1, wherein a DC insulation fault is detected by connecting a high-ohmic resistor between an intermediate circuit connection and the ground potential, wherein a DC voltage component of the insulation voltage between one of the intermediate circuit connections and the ground potential is determined before and after connecting the high-ohmic resistor, and wherein a ratio of the insulation voltages is determined, and a DC insulation fault is inferred from the ratio.

10. The method according to claim 1, wherein the insulation voltage from which the AC fault current flowing between an AC connection and the ground potential is determined is an AC voltage component of the insulation voltage.

11. A monitoring device for determining an AC insulation resistance between AC connections of an inverter and a ground potential, wherein DC connections of the inverter are connectable to a DC power source, and in an emergency standby operation, the AC connections of the inverter are connectable to an AC energy sink, the monitoring device comprising:

a fault current detection unit configured to determine an AC fault current flowing between an AC connection and the ground potential, from an insulation voltage present between one of the intermediate circuit connections and the ground potential or an intermediate circuit midpoint and the ground potential, and from an insulation impedance between the intermediate circuit connection and the ground potential or the intermediate circuit midpoint and the ground potential, and a calculation unit configured to calculate a phase shift between an AC phase angle of the AC voltage and a fault current phase angle of the AC fault current, and to calculate the AC insulation resistance from the phase shift.

12. The monitoring device according to claim 11, wherein a voltage measuring unit is provided which is configured to measure an insulation voltage present between one of the intermediate circuit connections and the ground potential, and wherein the fault current detection unit is configured to calculate the AC fault current from the insulation voltage and from an insulation impedance between the intermediate circuit connections and the ground potential.

13. The method according to claim 12, wherein the voltage measuring unit is configured to measure an AC voltage component of the insulation voltage present between one of the intermediate circuit connections and the ground potential.

14. An arrangement of an inverter and a monitoring unit according to claim 11.

15. The method according to claim 11, wherein the insulation voltage from which the AC fault current flowing between an AC connection and the ground potential is determined is an AC voltage component of the insulation voltage.

16. The method according to claim 13, wherein the fault current detection unit is configured to calculate the AC fault current from the AC voltage component of the insulation voltage and from an insulation impedance between the intermediate circuit connections and the ground potential.

* * * * *